(12) United States Patent
Kouvetakis et al.

(10) Patent No.: US 7,238,596 B2
(45) Date of Patent: Jul. 3, 2007

(54) METHOD FOR PREPARING $GE_{1-X-Y}SN_XE_Y$ (E=P, AS, SB) SEMICONDUCTORS AND RELATED SI-GE-SN-E AND SI-GE-E ANALOGS

(75) Inventors: John Kouvetakis, Mesa, AZ (US); Matthew Bauer, Hillsboro, OR (US); John Tolle, Gilbert, AZ (US); Candi Cook, Tempe, AZ (US)

(73) Assignee: Arizona Board of Regenta, a body corporate of the State of Arizona acting for and on behalf of Arizona State University, Tempe, AZ (US)

( * ) Notice: Subject to any disclaimer, the term of this patent is extended or adjusted under 35 U.S.C. 154(b) by 42 days.

(21) Appl. No.: 10/559,980

(22) PCT Filed: Jun. 14, 2004

(86) PCT No.: PCT/US2004/018968

§ 371 (c)(1),
(2), (4) Date: Dec. 8, 2005

(87) PCT Pub. No.: WO2004/114368

PCT Pub. Date: Dec. 29, 2004

(65) Prior Publication Data

US 2006/0134895 A1   Jun. 22, 2006

Related U.S. Application Data

(60) Provisional application No. 60/478,480, filed on Jun. 13, 2003.

(51) Int. Cl.
*H01L 21/20* (2006.01)
*C01G 17/00* (2006.01)
(52) U.S. Cl. ..................... 438/507; 423/89

(58) Field of Classification Search ............. 438/565, 438/569, 508, 507, 511
See application file for complete search history.

(56) References Cited

U.S. PATENT DOCUMENTS 5,198,387 A   3/1993   Tang et al.

(Continued)

FOREIGN PATENT DOCUMENTS

WO   WO 03/033781   4/2003

(Continued)

OTHER PUBLICATIONS

D. W. Jenkins, "Electronic properties of metastable GexSn1-x alloys", Phys. Rev. B., vol. 36, pp. 7994-8001 (1987).

(Continued)

*Primary Examiner*—Scott B. Geyer
*Assistant Examiner*—Reema Patel
(74) *Attorney, Agent, or Firm*—McDonnell Boehnen Hulbert & Berghoff, LLP

(57) ABSTRACT

A process for is provided for synthesizing a compound having the formula $E(GeH_3)_3$ wherein E is selected from the group consisting of arsenic (As), antimony (Sb) and phosphorus (P). $GeH_3Br$ and $[CH_3)_3Si]_3E$ are combined under conditions whereby $E(GeH_3)_3$ is obtained. The $E(GeH_3)_3$ is purified by trap-to-trap fractionation. Yields from about 70% to about 76% can be obtained. The $E(GeH_3)_3$ can be used as a gaseous precursor for doping a region of a semiconductor material comprising Ge, SnGe, SiGe and SiGeSn in a chemical vapor deposition reaction chamber.

25 Claims, 5 Drawing Sheets

U.S. PATENT DOCUMENTS

| | | |
|---|---|---|
| 5,532,183 A | 7/1996 | Sugawara et al. |
| 5,714,415 A | 2/1998 | Oguro |
| 6,410,434 B1 | 6/2002 | Mani |
| 6,441,716 B1 | 8/2002 | Doppalapudi et al. |
| 6,723,621 B1 | 4/2004 | Cardone et al. |
| 6,897,471 B1 | 5/2005 | Soref et al. |
| 6,911,084 B2 | 6/2005 | Kouvetakis et al. |
| 2003/0157787 A1 | 8/2003 | Murthy et al. |
| 2006/0134895 A1 | 6/2006 | Kouvetakis et al. |
| 2006/0163612 A1 | 7/2006 | Kouvetakis et al. |
| 2006/0236923 A1 | 10/2006 | Kouvetakis et al. |

FOREIGN PATENT DOCUMENTS

| | | |
|---|---|---|
| WO | WO 2004/114368 | 12/2004 |
| WO | WO 2005/001902 | 1/2005 |
| WO | WO 2005/015609 | 2/2005 |
| WO | WO 2006/009171 | 1/2006 |

OTHER PUBLICATIONS

K. A. Mader, "Band structure and instability of GexSn1-x alloys", Solid State Commun., vol. 69 (12), pp. 1123-1126 (1989).

G. He and H.A. Atwater, "Interband transitions in $Sn_xGe_{1-x}$ Alloys", Phys. Rev. Lett., vol. 79(10), pp. 1937-1940 (1997).

O. Gurdal, R. Desjardins, J. R. A. Carlsson, N. Taylor, H. H. Radamson, J.-E. Sundgren, and J. E. Greene, "Low-temperature growth and critical epitaxial thicknesses of fully strained metastable Ge1-x Snx (x≦0.26) alloys", J. Appl. Phys., vol. 83(1), pp. 162-170 (1998).

M. T. Asom, E.A Fitzgerald, A. R. Kortan, B. Spear, and L. C. Kimerling, "Epitaxial Growth of SnGe Alloys", Appl. Phys. Lett., vol. 55(6), pp. 578-580 (1989).

H. Höchst, M. A. Engelhardt, and D.W. Niles, "The MBE growth and electronic structure of $\alpha$-$Sn_xGe_{1-x}$ alloys", SPIE Proceedings, vol. 1106, pp. 165-171 (1989) (ABSTRACT).

C. A. Hoffman, et al., "Three-Band transport and cyclotron resonance in alpha -Sn and alpha -$Sn_{1-x}Ge_x$ grown by molecular-beam epitaxy", Phys. Rev. B. vol. 40(17): pp. 11693-11700, (1989).

W. Wegscheider, K. Eberl, U. Menczigar, and G. Abstreiter, "Single-cystal Sn/Ge superlattices on Ge substrates: Growth and structural properties", Appl. Phys. Lett., vol. 57(9), pp. 875-877 (1990).

O. Gurdal, et al., "Growth of metastable $Ge_{1-x}Sn_x$/Ge strainted layer superlattices on Ge(001)2×1 by temperature-modulated molecular beam epitaxy", Appl. Phys. Lett., vol. 67(7), pp. 956-958 (1995).

P. R. Pukite, A. Harwit, and S.S. Iyer, "Molecular beam epitaxy of metastable, diamond structure $Sn_xGe_{1-x}$ alloys", Appl. Phys. Lett. 54 (21), pp. 2142-2144 (1989).

M. Bauer, et al., "Ge-Sn semiconductors for band-gap and lattice engineering", Appl. Phys. Lett. 81(16), pp. 2992-2994 (2002).

L. Bellaiche, S.-H. Wei and Z. Zunger, "Localization and percolation in semiconductor alloys: GaAsN vs GaAsP", Phys. Rev. B 54, 17568-17576 (1996).

J. Taraci, J. Tolle, M. R. M. Cartney, J. Menendez, M. A. Santana, D. J. Smith, and J. Kouvetakis, "Simple chemical routes to diamond-cubic germanium-tin alloys", App. Phys. Lett. 78(23), pp. 3607-3609 (2001).

J. Taraci, S. Zollner, M. R. McCartney, J. Menéndez, M. A. Santana, D. J. Smith, A. Haaland, A. V. Tutukin, G. Gundersen, G. Wolf, and J. Kouvetakis, "Synthesis of silicon-based infrared semiconductors in the Ge-Sn system using molecular chemistry methods", J. of the Am. Chem. Soc., col. 123(44), pp. 10980-10987 (2001).

V. Atluri, N. Herbots, D. Dagel, H. Jacobsson, M. Johnson, R. Carpio, and B. Fowler, "Comparison and reproducibility of H-passivation of Si(1000) with HF in methanol, ethanol, isopropanol and water by IBA, TMAFM, FTIR", Mater. Res. Soc. Symp. Proc. 477, pp. 281-292 (1997) (ABSTRACT).

Z. Charafi and N. Bouarissa, "The effect of the violation of Vegard's law on the optical bowing, in $Si_{1-x}Ge_x$ alloys", Phys. Lett. A. vol. 234, pp. 493-497 (1997).

H. Kajiyama, S-I. Muramatsu, T. Shimada, and Y. Nishino, "Bond-length relaxation in crystalline $Si_{1-x}Ge_x$ alloys: An extended x-ray-absorption fine-structure study", Phys. Rev. B vol. 45(24), pp. 14005-14010 (1992).

F. Cerdeira, W. Dreyrodt, and M. Cardona, "Resonant raman scattering in germanium", Solid State Commun., vol. 10, 591-595 (1972).

M.M. McGibbon, N.D. Browning, M.F. Chisholm, A.J. McGibbon, S.J. Pennycook, V. Ravikumar, V.P. Dravid, "Direct determination of grain boundary atomic structure in $SrTio_3$," Science, vol. 266, pp. 102-104 (1994).

P. Mock, T. Topuria, N. D. Browning, G. R. Booker, N. J. Mason, R. J. Nicholas, M. Dobrowolska, S. Lee, and J. K. Furdyna, "Internal self-ordering in In(Sb,As), (In,Ga) Sb, and (Cd,Zn,Mn) Se nano-agglomerates/quantum dots", Appl. Phys. Lett., vol. 79(7), pp. 946-948. (2001).

D.M. Ceperley, B.J. Alder, "Ground State of the Electron Gas by Stochastic Method", Phys. Rev. Lett., vol. 45, pp. 566-569 (1980).

T G. Kresse and J. Hafner, "Ab initio molecular dynamics for liquid metals", Phys. Rev. B47(1), pp. R558-561 (1993).

G. Kresse and J. Hafner, "Ab ignition molecular-dynamics simulation of the liquid-metal-amorphous-semiconductor transition in germanium", Phys. Rev. B49(20), pp. 14251-14269 (1994).

G. Kresse, J. Furthmuller, "Efficiency of ab-initio total energy calculations for metals and semiconductors using a plane-wave basis set", Comput. Mater. Sci. vol. 6, pp. 15-50 (1996).

G. Kresse, J. Furthmuller, "Efficient iterative schemes for ab initio total-energy calculations using a plane-wave basis set", Phys. Rev. B54(16), pp. 11169-11186 (1996).

R. A. Soref and L. Friedman, "Direct-gap Ge/GeSn/Si and GeSn/Ge/Si heterostructures", Superlattices and Microstructures, vol. 14(2), 189-193 (1993).

M. R. Bauer, J. Kouvetakis, D.J. Smith and J. Menendez, "Tunable band structure in diamond cubic tin germanium alloys grown on Si", Solid State Commun., vol. 127, 355-359 (2003).

M.R. Bauer, P. Crozier, A. V. G Chizmeshya and J. D. Smith and J. Kouvetakis, "GeSn superstructured materials for Si-based optoelectronics", Appl. Phys. Lett. vol. 83, pp. 3489-3491 (2003).

M. Bauer et al., "Tunable band structure in diamond-cubic tin-germanium alloys grown on silicon substrates", Solid State Communications, vol. 127 (2003), pp. 355-359.

S. Cradock, E. A. V. Ebsorth, G. Davidson, L. A. Woodard, "Studies in Germyl Chemistry.3. Trigermylphosphine", J. Chem. Soc. A, 8, pp. 1229-1233 (1967).

D. W. H. Rankin, A. G. E. Robiet, G. M. Sheldrick, 5 Beagley, T. G. Hewit, "An electron Diffraction of the Molecular Structures of Trigermylphosphine and Trisilylstibine in the Gas Phase", J. Inorg. Nucl. Chem., 31, pp. 2351-2357 (1969).

E. A. V. Ebsworth, D. J. Hutchinson, D. W. H. Rankin, "The Preparation, properties, and Gas-Phase Molecular-Structure of 1,1-Difluoro-2,2-Digermylbiphosphone",J. Chem. Res. Synop, 12, pp. 393, (1980).

E. A. V. Ebsworth, D. W. H. Rankin, G. M. Sheldrick, "Preparation and Properties of Trigermyl-arsine and -stibine", J. Chem. Soc. A, 11, pp. 2828-2830 (1968).

D. E. Wingeleth, A.D. Norman, "Redistribution of primary silyl-and germylphospines; synthesis of trisilyl-and trigermylphosphines", Phosphorus Sulfur, 39(1-2), pp. 123-129, (1988).

G. A. Forsyth, D. W. H. Rankin, H. E. Robertson, "Determination of the molecular structure of Tris (Trimethylsilyl) phosphine in the gas phase by electron diffraction, supported by molecular mechanics calculations", J. Mol. Struct. vol. 239, pp. 209-217, (1990).

H. Schumann, H. J. Kroth, "NMR-Untersuchungen an Organoelementen(IVb)-Phosphinen, 2. Substituenteneinflusse auf die P-chemischen Verschiebungen von Trimethylelement (IVb)-phosphinen", Z. Naturforsch., B: Anorg. Chem., Chem. 32B, pp. 513-515, (1977).

G. Becker, H. Fredenblum, O. Mundt, M. Reti, M. Sachs, Synthetic Methods of Organometallic and Inorganic Chemistry, 3, pp. 193-198 (1996).

S. Schulz, M. Nieger, "Synthesis and characterization of organogallium-antimony compounds", J. of Organomet. Chem., vol. 570, pp. 275-278 (1998).

H. Schumann, U. Frank, W. W. Du Mont, F. Marschner, "Organometallarsine", J. Organomet. Chem, vol. 222, pp. 217-225 (1981).

M. Ates, H. J. Breunig, M. Denker, "Formation of $(Me_3M)_3Sb$ (M=Ge, Sn, Pb) and $(Me_3M)_4Sb_2$ (M=Pb) by reaction of $(Me_3Si)_3Sb$ with $Me_3MCl$", Phosphous, Sulfur Silicon Relate. Elem., vol. 102, pp. 287-289 (1995).

H. Schumann, A. Roth, O. Steizer, M. Schmidt, "Pyramidenformige Molekule Mit Dem Atomskelett", Inorg. Nucl. Chem. Lett. 2, pp. 311-312, (1986).

G. Davidson, L. A. Woodward, E. A. V. Ebsworth, G. M. Sheldrick, "The vibrational spectra and structure of trisilylarsine and trisilylstibine", Spectrochim. Acta, Part A, vol. 23, pp. 2609-2616, (1967).

B. Beagley, A. G. Robiette, G. M. Sheldrick, "The Molecular Structures of (SiH3)3P and (SiH3)3As", Chem. Commun, 12, pp. 601-602 (1967).

A. Blake, E. A. V. Ebsworth, S. G. D. Henderson, "Structure of trisilylphosphine, $P(SiH_3)_x$, at 100K", Acta Crystallogr., Sect. C: Cryst. Struct. Commun, C47, pp. 486-489, (1991).

H. Siebert, J. Eints, "Neuvermessung des schwingungsspektrums von trisilylphosphin", J. Mol. Struct. vol. 4, pp. 23-28, (1969).

D. C. McKean, "On the spectroscopic evidence for geometry in $(SiH_3)_3P$ and $(SiH_3)_3As$", Spectrochim. Acta, Part A, vol. 24A, pp. 1253-1254 (1968).

J. E. Drake, J. Simpson, "Reactions of Monosilylarsine with Some Boron Lewis Acids and the Reaction of Monosilylphosphine with Boron Tribromide", J. Chem. Soc. A. 5, pp. 1039-1043 (1968).

E. H. Parker and T. E. Whall, "SiGe heterostructure CMOS circuits and applications", Solid State Electronics 43(8), pp. 1497-1506 (1999).

R. A. Soref and C. H. Perry, "Predicted band gap of the new semiconductor SiGeSn", J. Appl. Phys. 69, pp. 539-541 (1991).

K. A. Johnson and N. W. Ashcroft, "Electronic structure of ordered silicon alloys: Direct-gap systems", Phys. Rev. B 54, pp. 14480-14486 (1996).

A. R. Kost, in Infrared-Applications-of-Semiconductors-II. Symposium, (Mater. Res. Soc., 1998). pp. 3-10 (ABSTRACT).

A. W. Bett, F. Dimroth, G. Stollwerck, and O. V. Sulima, "III-V compounds for solar cell applications", Appl. Phys. A: materials Science & Processing, vol. 69(2), pp. 119-129 (1999).

R. Gaska, A. Zukauskas, M. S. Shur, and M. A. Khan, "Progress in III-nitride based white light sources", Proceedings of the SPIE, vol. 4776, pp. 82-96 (2002).

R. Bauer, C. Ritter, P. Crozier, J. Menendez, J. Ren, and J. Kouvetakis, "Synthesis of ternary Si-Ge-Sn semiconductors on Si(100) via SnxGe1-x buffer layers", Appl. Phys. Lett. 83 (11), 2163-2165 (2003).

H.K. Shin, D.J. Lockwood, J.-M. Baribeau, "Strain in coherent-wave SiGe/Si superlattices", Solid State Commun., vol. 114(10), pp. 505-510 (2000).

M. Meléndez-Lira, J. D. Lorentzen, J. Menéndez, W. Windl, N. Cave, R. Liu, J. W. Christiansen, N. D. Theodore, and J. J. Candelaria, "Microscopic carbon distribution in $Si_{1-y}C_y$ alloys: A Raman scattering study", Phys. Rev. B 56, pp. 3648-3650 (1997).

C.S. Cook, S. Zollner, M. R. Bauer, P. Aella, J. Kouvetakis, and J. Menendez, "Optical constants and interband transitions of $Ge_{1-x}Sn_x$ alloys (x< 0.2) grown on Si by UHV-CVD", Thin Solid Films 455-456, pp. 217-221 (2004).

Chizmeshya, et al., "Experimental and Theoretical study of deviations from Vegards Law in the $Ge_{1-x}$ $Ge_{1-x}$ system", Chem. Of Matls., vol. 15, pp. 2511-2519 (2003).

Aella, et al., "Structural and optical properties of $Sn_xSi_yGe_{1-x-y}$ alloys", App. Phys. Lett. vol. 84, pp. 888-890 (2004).

Roucka, et al., "Versatile buffer layer architectures based on $Ge_{1-x}Sn_x$ alloys", Appl. Phys. Let. vol. 86(19), pp. 191912-191914 (2005).

He, et al., "Synthesis of expitaxial $Sn_xGe_{1-x}$ alloy films by ion-assisted molecular beam epitaxy", App. Phys. Lett., vol. 68(5), pp. 664-666 (1996). Pristovsek, et al., "Growth of strained gaAsSb layers on GaAs (001) by MOVPE", Journal of Crystal Growth, vol. 276, pp. 347-353 (2005).

Pristovsek, et al., "Growth of strained gaAsSb layers on GaAs (001) by MOVPE", Journal of Crystal Growth, vol. 276, pp. 347-353 (2005).

Wosinski, et al., "Deep levels caused by misfit dislocations in gaAsSb/GaAs heterostructures", Appl. Phys. Lett., vol. 67(8), pp. 1131-1133.

Dvorak, et al., "300 GHz InP/GaAsSb/InP double HBTs with high current capability and BVCEO < 6V", IEEE Electron Device Letters, vol. 22(8), pp. 361-363 (2001).

Ryu Sang-Wan et al., "Optical characterization and determination of conduction band offset of type-II GaAsSb/InGaAs QW", Semiconductor Science and Technology, vol. 19, pp. 1369-1372 (2004).

Dowd, et al., "Long wavelength GaAsP/GaAs/GaAsSb VCSELs on GaAs substrates for communication applications", Electronics Letters, vol. 39(13), pp. 987-988 (2003).

Zheng, et al., "Demonstration of High-Speed staggered lineup GaAsSb-InP Unitraveling Carrier Photodiodes", IEEE Photonics Technology Letters, vol. 17(3), pp. 651-653 (2005).

Sun, et al., "GaAsSb: a novel material for near infrared photodetectors on GaAs substrates", Selected Topics in Quantum Electronics, IEEE Journal, vol. 8(4), pp. 817-822 (2002).

Kaniewski J., et al., "Resonant cavity enhanced InGaAs photodiodes for high speed detection of 1.55 μm infrared radiation", Proceedings of SPIE-The International Society for Optical Engineering (2005), vol. 5783 (Pt. 1, Infrared Technology and Applications XXXI), pp. 47-56.

Kang, Y., et al., "InGaAs-on-Si single photon avalanche photodetectors", Applied Physics Letters (2004), 85(10), pp. 1668-1670.

Kim S., et al., "High Performance 0.1μm GaAs Pseudomorphic High Electron Mobility Transistors with Si Pulse-Doped Cap Layer for 77GHz Car Radar Applications", Jpn. J. App. Phys. 44, pp. 2472-2475 (2005).

Cristea P., et al., "Growth of AlAsSb/InGaAs MBE-layers for all-optical switches", J. Cryst. Growth 278(1-4), pp. 544-547 (2005).

Li Y.J., et al., "Improved characteristics of metamorphic InAlAs/InGaAs high electron mobility transistor with symmetric graded $In_xGa_{1-x}As$ channel", J. of Vac. Sci. Tech. B 22(5), pp. 2429-2433 (2004).

Mao R. W., et al., "Fabrication of 1.55 μm Si-Based Resonant Cavity Enhanced Photodetectors Using Sol-Gel Bonding" IEEE Photonics Technology Letters 16(8), pp. 1930-1932 (2004).

Pauchard A., et al., "Wafer-bonding InGaAs/silicon avalanche photodiodes", Proceedings of SPIE-The International Society for Optical Engineering, vol. 4650 (Photodetector Materials and Devices VII), pp. 37-43 (2002).

Takano Y., et al., "Residual strain and threading dislocation density in InGaAs layers grown on Si substrates by metalorganic vapor-phase epitaxy", Appl. Phys. Lett., vol. 78(1), pp. 93-95 (2001).

Chriqui Y., et al., "Long wavelength room temperature laser operation of a strained InGaAs/GaAs quantum well structure monolithically grown by metalorganic chemical vapour deposition on a low energy-plasma enhanced chemical vapour deposition graded misoriented Ge/Si virtual substrate", Optical Materials, vol. 27, pp. 846-850 (2005).

Y.K. Yang, et al., "Comparison of luminescent efficiency of InGaAs quantum well structures grown on Si, GaAs, Ge, and SiGe virtual substrate", J. Appl. Phys., vol. 93(9), pp. 5095-5102 (2003).

Shiu Fai Li, et al., "Scaling law for the compositional dependence of Raman frequencies in GeSi and SnGe alloys, Appl. Phys. Lett., vol. 84, pp. 867-869 (2004).

Cook, et al., "Optical constants and interband transitions of Ge1-xSnx alloys (x<0.2) grown on Si", In press Thin Solid Films, vol. 455-456, pp. 217-221 (2004).

Menendez, et al., Type-I $Ge/Ge_{1-x-y}$ $Si_xSn_y$ strained-layer heterostructures with a direct Ge band gap, Appl. Phys. Lett., vol. 85(7), pp. 1175-1177 (2004).

Park, et al., "Observation olarge stark shift in $Ge_xSi_{1-x}$/Si multiple quantum wells", J. Cac. Sci. Technol. B, vol. 8(2), pp. 217-220 (1990).

Baier, et la., "Type-II band alignment in Si/Si1_xGex quantum wells for photoluminescence line shifts due to optically induced band-bending effects: Experiment and theory", Phys. Rev. B, vol. 50(20), pp. 15191-15196 (1994).

Temkin et al., "GexSi1-x strained-layer superlattice waveguide photodetectors operating near 1.3 _m", Appl. Phys. Lett., vol. 48(15), pp. 963-965 (1986).

Li, et al., (2000), "Observation of quantum-confined stark shifts in SiGe/Si type-1 multiple quantum wells", J. Appl. Phys. vol. 87(11), pp. 8195-8197.

Miyake, et al., "Absence of stark shift in strained Si1-xGex/Si type-I quantum wells", Appl. Phys. Lett., vol. 68(15), pp. 2097-2099 (1996).

O. Qasaimeh, et al., (1997), "Electroabsorption and Electrooptic Effectin SiGe-Si Quantum Wells: Realization of Low-Voltage Optical Modulators", IIEEE J. Quantum Electron, vol. 33 (99), pp. 1532-1536.

Jaros, "Simple analytic model for heterojunction band offsets", Phys. Rev. B. vol. 37(12), pp. 7112-7114 (1988).

Tolle, et al., "Epitaxial growth of group III nitrides on Si substrates via a reflective lattice-matched zirconium diboride buffer layer", Appl. Phys. Lett., vol. 82(15), pp. 2398-2400 (2003).

Hu, et al., "Nucleation and growth of epitaxial $ZrB_2(0001)$ on Si(111)", Journal of Crystal Growth, vol. 267, (2004) pp. 554-563.

Tolle, et al., "Epitaxial growth of AlGaN by metalorganic chemical vapor deposition on Si(111) via a $ZrB_2(0001)$ buffer layer", Appl. Phys. Lett, vol. 84(18), pp. 3510-3512 (2004).

R.F.C. Farrow et al., "The growth of metastable, heteroepitaxial films of α-Sn by metal beam epitaxy", J. Cryst. Growth, vol. 54, pp. 507-518 (1981).

G Becker et al., "Notiz uber eine einfache methode zur darstellung von tris (trimethylsilyl) phosphin", Chem. Ber., vol. 108, pp. 2484-2485 (1975).

H. Schumann et al., "Trimethylsilyldiphosphane", J. Organomet. Chem., vol. 88, pp. C13-C16, (1975).

H. Schumann et al., "Eine einfache Methode zur Synthese von Organosilylphosphinen", J. Organometalic Chem. vol. 55, pp. 257-260 (1973).

H. Burger et al., "Schwingungsspektren und Kraftkonstanten von Silyl-und Trimethylsilyl-Verbindungen von Elementen der 5. Gruppe", Spectrochimica. Acta, vol. 26A, pp. 671-683, (1970).

H.J. Breunig et al., "Crystal structures of tris (trimethylsilyl) stibine and pentacarbonyl(tris(trimethylsilyl) stibine) chromium", Journal of Organometallic Chemistry, vol. 608 (2000), pp. 60-62.

L. Rosch et al., "Darstellung und untersuchung von phosphinkomplexen mit aluminiumtrichlorid und aluminumtriathyl", Anorg. Allg. Chem, vol. 426, pp. 99-106 (1976).

H. Schumann et al., "Substituentenaustauschreaktionene zwischen Tris (Trimethylsilyl) phosphan und Trimethylgermanium- und Trimethylzinnchlorid", Z. Naturforsch., vol. 29B, 608-610 (1974).

H. Schumann et al., "Darstellung und Schwingungsspektren von Trimethylsilyl-, Trimethylgermyl-und Trimethyl-stannyl-tert-butylphosphinen", Chem. Ber., vol. 107, pp. 854-869 (1974).

A.V.G. Engelhardt et al. Naturforsch., "Über die IR-, Raman-und $^{31}$P-NMR-Spektren ciniger phosphinderivate von germanium und zinn", B: Anorg. Chem., Org. Chem., Biochem, Biophys., Biol. vol. 22b, pp. 352-353 (1967).

J.W. Anderson, J.E. Drake, "Trimethylstannylarsines", Canadian Journal of Chemistry, vol. 49, pp. 2524-2528 (1971).

E. Niecke, H. Westermann, "A Simple method for the preparation of Tris (trimethylsilyl) phosphine", Synthesis, (1988), p. 330.

H.J. Breunig et al., Naturforsch., "Tetrakis (Trimethylsilyl) distiban", Z. Naturforsch., vol. 34B, pp. 926-928 (1979).

H.J. Breunig, "Synthese von Tetrakis (trimethylgermyl)-Distaiban", Z. Naturforsch., vol. 33B, pp. 244-245, (1978).

Spanier, et al., "The Synthesis of Germylsilane from Silane and German in a Silent Electric Discharge", Inorganic Chemistry, (1962), pp. 215-216.

Kouvetakis, et al., U.S. Appl. No. 10/559,981, filed Dec. 8, 2005.
Kouvetakis, et al., U.S. Appl. No. 10/559,979, filed Dec. 8, 2005.

METHOD FOR PREPARING $GE_{1-X-Y}SN_XE_Y$ (E=P, AS, SB) SEMICONDUCTORS AND RELATED SI-GE-SN-E AND SI-GE-E ANALOGS

RELATED APPLICATION DATA

This application is based on and claims the benefit of U.S. Provisional Patent Application No. 60/478,480 filed on Jun. 13, 2003, the disclosure of which is incorporated herein by this reference.

STATEMENT OF GOVERNMENT FUNDING

The United States Government provided financial assistance for this project through the National Science Foundation under Grant No. DMR 0221993 and through the Army Research Office Grant No. DAA 19-00-0-0471. Therefore, the United States Government may own certain rights to this invention.

BACKGROUND

This invention relates generally to semiconductor materials and, more particularly, to doping and superdoping in situ a broad family of Si-based semiconductors such as Ge, SnGe, SiGe, and SiGeSn with As, P, and Sb (Group V element).

It has been known for many years—on theoretical grounds—that the SnGe alloy system and the SiGeSn alloy system should have properties that would be very beneficial in microelectronic and optoelectronic devices. This has stimulated intense experimental efforts to grow such compounds. For many years the resulting material quality has been incompatible with device applications. Recently, however, we successfully synthesized device-quality SnGe alloys directly on Si substrates. See M. Bauer, J. Taraci, J. Tolle A. V. G Chizmeshya, S. Zollner, J. Menendez, D. J. Smith and J. Kouvetakis, *Appl. Phys. Lett* 81, 2992 (2002); M. R. Bauer, J. Kouvetakis, D. J. Smith and J. Menendez, *Solid State Commun.* 127, 355 (2003); M. R. Bauer, P. Crozier, A. V. G Chizmeshya and J. D. Smith and J. Kouvetakis *Appl. Phys. Lett.* 83, 3489 (2003), which are incorporated herein by this reference.

In order to fabricate devices using these materials, however, it is necessary to dope thin films of the materials with donor and acceptor elements, such as B, P, As and Sb. Previously known methods for doping Si-based semiconductors with As or P have significant limitations. Typically n-doping is performed using a molecular source approach or by ion implantation using solid sources of the dopant elements. Ion implantation has advantages such as relatively low processing temperatures and the short processing times. However, it also has some major disadvantages, such as significant substrate damage and composition gradients across the film. For the thermodynamically unstable Sn—Ge lattice the re-growth temperatures, that are required to repair the implantation damage of the crystal, may exceed the temperature stability range of the film, resulting in phase segregation and precipitation of Sn. In addition, with ion implantation there are limits as to how much dopant can be introduced into the structure. Ion implantation methods and conventional CVD of the well known $PH_3$ and $AsH_3$ analogs require severe and often hostile processing conditions and are expected to be incompatible with the properties and stability range of the relatively fragile Ge—Sn lattice. In addition $PH_3$ and $AsH_3$ are highly toxic and in fact can be lethal in relatively small doses.

There is a need, therefore, for a method of incorporating appropriate concentrations of activated atoms into the lattice of the Ge—Sn system and in $Ge_{1-x-y}Sn_xE_y$ (E=P, As, Sb) semiconductors and related Si—Ge—Sn—E and Si—Ge—E analogs. It is an object of the present invention to provide such a method.

It is another object of the present invention to such a method that is practical to implement.

Additional objects and advantages of the invention will be set forth in the description that follows, and in part will be apparent from the description, or may be learned by practice of the invention. The objects and advantages of the invention may be realized and obtained by the instrumentalities and combinations pointed out herein.

SUMMARY OF THE INVENTION

To achieve the foregoing objects, and in accordance with the purposes of the invention as embodied and broadly described in this document, we provide a novel process for incorporating group V atoms such as P, As and Sb into. Ge—Sn materials and other group IV semiconductors. The process includes synthesizing a compound having the formula $E(GeH_3)_3$ wherein E is selected from the group consisting of arsenic (As), antimony (Sb) and phosphorus (P). According to a preferred approach, $GeH_3Br$ with $[(CH_3)_3Si]_3E$ are combined under conditions whereby $E(GeH_3)_3$ is obtained. The $E(GeH_3)_3$ is then purified by trap-to-trap fractionation. $E(GeH_3)_3$ can be obtained with a yield from about 70% to about 76%.

According to another aspect of the invention, a method for doping a region of a semiconductor material in a chemical vapor deposition reaction chamber is described. The method includes introducing into the chamber a gaseous precursor having the formula $E(GeH_3)_3$, wherein E is selected from the group consisting of arsenic (As), antimony (Sb) and phosphorus (P). The semiconductor material can comprise germanium (Ge), SiGeSn, SiGe or SnGe.

According to another aspect of the invention, a method for depositing a doped epitaxial Ge—Sn layer on a substrate in a chemical vapor deposition reaction chamber is described. The method includes introducing into the chamber a gaseous precursor comprising $SnD_4$ mixed in $H_2$ under conditions whereby the epitaxial Ge—Sn layer is formed on the substrate, including a silicon substrate, and introducing into the chamber a gaseous precursor having the formula $E(GeH_3)_3$, wherein E is selected from the group consisting of arsenic (As), antimony (Sb) and phosphorus (P). The gaseous precursor is introduced at a temperature in a range of about 250° C. to about 350° C.

BRIEF DESCRIPTION OF THE DRAWINGS

The accompanying drawings, which are incorporated in and constitute a part of the specification, illustrate the presently preferred methods and embodiments of the invention. Together with the general description given above and the detailed description of the preferred methods and embodiments given below, they serve to explain the principles of the invention.

DESCRIPTION

Figure 1:
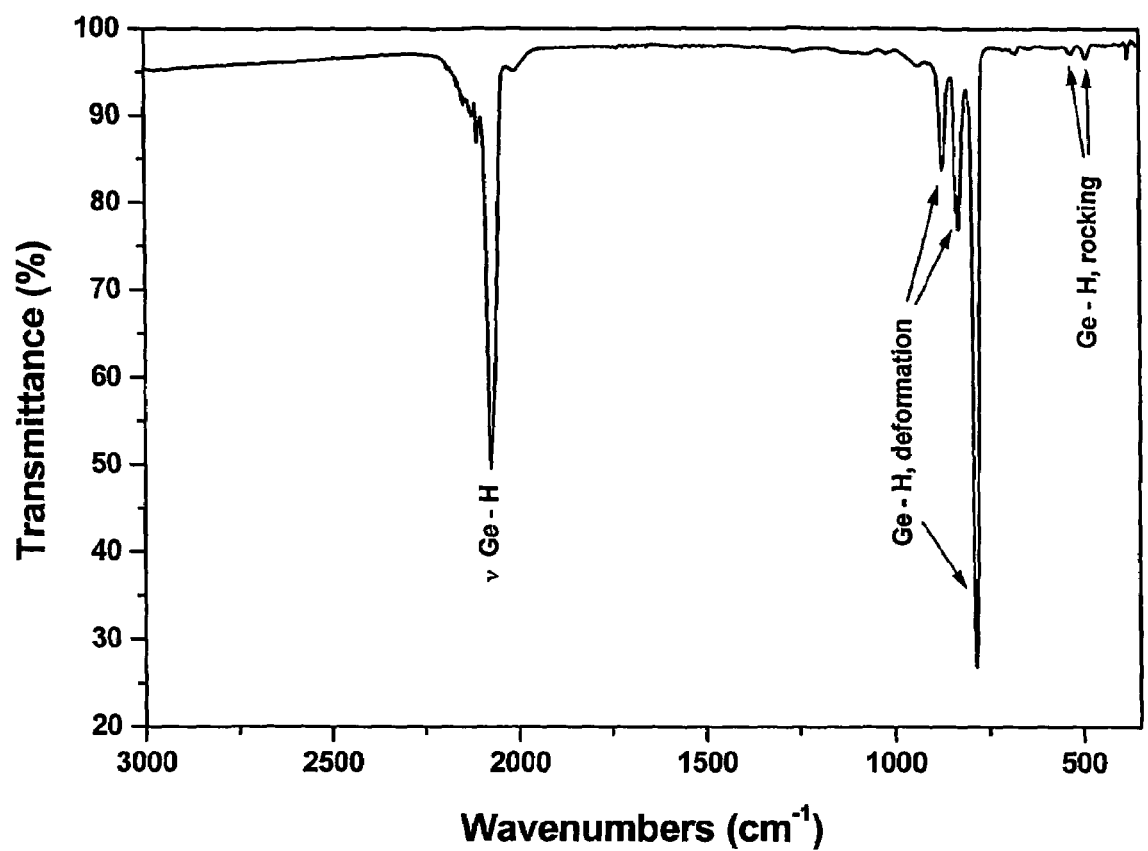
FIG. 1 shows a typical gas-phase FTIR spectrum of trigermylarsine, $(H_3Ge)_3As$ showing sharp absorption bands at 2077 (Ge—H stretching), 873, 829, 785 (Ge—H deformation), 530 and 487 $cm^{-1}$ (Ge—H rocking).

In this specification, we describe new synthesis strategies, based on novel molecular hydride sources, to incorporate Group V atoms such as P, As and Sb into the diamond lattice of Group IV semiconductor materials, including the Ge and Si—Ge and SiGeSn systems These sources are the trigermylphosphine $P(GeH_3)_3$, trigermylarsine $As(GeH_3)_3$, and trigermylstibine $Sb(GeH_3)_3$ family of compounds. These molecular precursors are stable and volatile at room temperature and possess the necessary reactivity to dissociate completely at growth conditions for Ge, SiGe, SnGe or SiGeSn systems, via elimination of benign and stable byproducts that do not contaminate the film. The byproduct is the $H_2$ molecule, indicating that the precursors must be carbon-free inorganic hydrides that incorporate the desired elements P, As and Sb within a Ge coordination environment The reactions of these molecules with appropriate concentrations of $SnD_4$ and/or $(GeH_3)_2$ will generate Ge—Sn compositions doped with the desired levels of a group V element.

According to one aspect of our invention, the $As(GeH_3)_3$, $Sb(GeH_3)_3$, and $P(GeH_3)_3$ hydride precursors are prepared using a novel high-yield method. These precursors are then used in a novel doping method that involves in situ incorporation of the dopant atoms into the Ge, SiGe, SnGe or SiGeSn system. The hydride compounds are co-deposited with appropriate Si/Ge/Sn sources to form Sn—Ge or Si—Ge—Sn doped with the appropriate carrier type. In the case of As, we have succeeded in increasing the free carrier concentration by making and using precursors with direct Ge—As bonds, such as $As(GeH_3)_3$. This unique species is an ideal molecular source for low temperature, low cost, high efficiency doping applications that are conducted via simple, single-step processes. The compound is carbon-free inorganic hydride and is designed to furnish a basic structural unit comprised of the dopant atom surrounded by three Ge atoms. This arrangement produces homogeneous, substitution of dopant atoms at high concentrations without clustering or segregation.

The $P(GeH_3)_3$, $As(GeH_3)_3$, and $Sb(GeH_3)_3$ precursors can be used to dope functional materials such as Ge, SiGe, SnGe or SiGeSn at levels that cannot be achieved by conventional methods. We can increase the free carrier concentration by using these precursors with direct Ge—P, Ge—As, and Ge—Sb bonds and atomic arrangements that are structurally compatible with the Ge—Sn lattice. Previous reports provide only preliminary results of the synthesis and some basic physical properties of these $P(GeH_3)_3$, $As(GeH_3)_3$, and $Sb(GeH_3)_3$ compounds. See S. Cradock, E. A. V. Ebsorth, G. Davidson, L. A Woodard, *J. Chem. Soc. A*, 8, 1229, (1967); D. W. H. Rankin, A. G. E. Robiet, G. M. Sheldrick, 5 Beagley, T. G. HeMit, *J. Inorg. Nucl. Chem.*, 31, 2351, (1969); E. A. V. Ebswort, D. J. Hutchison, J. Douglas, D. W. H. Rankin, *J. Chem. Res., Synop*, 12, 393, (1980); E. A. V. Ebsworth, D. W. H. Rankin, G. M. Sheldrick, *J. Chem. Soc. A*, 11, 2828, (1968). D. E. Wingeleth, A. D. Norman, *Phosphonus Sulfur*, 39, 123, (1988). These previously-described procedures, however, provide low yields and in certain cases only traces of the desired product are produced. In addition these procedures are exceedingly difficult and involve steps that can be potentially dangerous especially for the scaling up phase of the work to produce industrial-scale quantities of the desired compound. Our work demonstrates new and practical methods to prepare, isolate, purify and handle these molecules in sufficient quantities to make them useful as chemical reagents as well as CVD gas sources for semiconductor applications.

Preparation of $(GeH_3)_3P$, $(Ge H_3)_3As$, and $(Ge H_3)_3Sb$ for Dopant Applications Conventional n-doping of semiconductor materials with P or As atoms is performed by use of molecular $PH_3$ and $AsH_3$ (the $SbH_3$ analog is unstable) or by ion implantation using solid sources of the elements. As discussed above, ion implantation causes significant substrate damage and composition gradients across the film. For the thermodynamically unstable Sn—Ge lattice, the re-growth temperatures that will be needed to repair the implantation damage of the Sn—Ge crystal may exceed the temperature stability range of the film, resulting in phase segregation and precipitation of Sn. Therefore, for doping of the Sn—Ge lattice it is desirable to use a low-temperature molecular source approach since the introduction of the dopant takes place in situ during film growth and as host Ge—Sn the lattice is generated.

Using a typical growth process conducted by either gas-source molecular beam epitaxy (GS-MBE) or chemical vapor deposition (CVD), we chose to co-deposit a compound with the general formula $E(GeH_3)_3$ (E=P, As, or Sb) along with the host Ge—Sn material. We determined that this growth reaction would eliminate hydrogen and generate in situ the $Ge_3E$ molecular core, which contains the dopant atom B surrounded by three Go atoms. This arrangement represents a simple compositional and structural building block of the host lattice. Using the $Ge_3E$ core as the building block would also completely exclude formation of undesirable E-E bonding arrangements that may lead to clustering or segregation of the E dopant species. Thus we believed this new approach would be most likely to yield a highly homogeneous random distribution of the dopant at distinct atomic sites throughout the film. Furthermore, the doping levels could be precisely controlled by careful adjustment of the flux rate of the precursor during the course of the layer growth. An important benefit of $As(GeH_3)_3$ [or $P(GeH_3)_3$] is its higher reactivity compared to AsH$_3$, which allows lower depositions temperatures than those employed in conventional CVD doping processes utilizing AsH$_3$ and related hydrides of phosphorus.

Numerous publications in the literature deal with synthesis, properties and reactions of the compounds (Me$_3$Si)$_3$E, (Me$_3$Ge)$_3$E, (Me$_3$Sn)$_3$E, and Ne$_3$Pb)$_3$E (E=P, As or Sb), which are the organometallic analogs of the desired precursors. See G. A. Forsyth, D. W. H. Rankin, H. E. Robertson, *J. Mol. Struct.* 239, 209, (1990); H. Schumann, H. J. Kroth, *Z. Naturforsch., B: Anorg. Chem., Org. Chem.* 32B, 523, (1977); G. Becker, H. Freudenblum, O. Mundt, M. Reti, M. Sachs, *Synthetic Methods of Organometallic and Inorganic Chemistry*, 3, 193, (1996); S. Schulz, M. Nieger, *J. of Organomet. Chem.* 570, 275, (1998); H. Schumann, U. Frank, W. W. Du Mont, F. Marschner, *J. Organomet. Chem,* 222, 217, (1981); M. Ates, H. J. Breunig, M. Denker, Phosphous, *Sulfur Silicon Relate. Elem.* 102, 287, (1995); H. Schumann, A. Roth, O. Stelzer, M. Schmidt, *Inorg. Nucl. Chem. Lett.* 2, 311, (1986). These materials have been widely utilized as common reagents in classical metathesis reactions to produce numerous molecular systems that incorporate the (e$_3$Si)$_2$E, (Me$_3$Ge)$_2$E, and (Me$_3$Sn)$_2$E ligands. However, there has been relatively little activity associated with the corresponding hydrides (which are completely free of strong C—H bonds that introduce carbon contaminants in the films) despite their potential importance as precursors for deposition of novel microelectronic and optoelectronic materials.

The (SiH$_3$)$_3$E family of molecules has been synthesized and their properties have been investigated. See G. Davidson, L. A. Woodward, E. A. V. Ebsworth, G. M; Sheldrick, *Spectrochim. Acta, Part A,* 23, 2609, (1967); B. Beagley, A. G. Robiette, G. M. Sheldrick, *Chem. Commun,* 12, 601, (1967); A. Blake, B. A. V. Ebsworth, S. G. D. Henderson, *Acta Crystallogr., Sect. C. Cryst. Struct. Commun,* C47, 489, (1991); H. Siebert, J. Eints, *J. Mol. Struct.* 4, 23, (1969); D. C. McKean, *Spectrochim. Acta, Part A,* 24, 1253, (1968); J. B. Drake, J. Simpson, *J. Chem. Soc. A.* 5 1039, (1968). The high reactivity of the Si—H bonds and the absence of carbon from the molecular architecture indicated to us that these compounds could be ideal sources for low temperature depositions of semiconductors doped with P and As. The known methods for synthesizing these compounds, however, are complex and require use and manipulation of highly toxic, explosive and pyrophoric reagents such as PH$_3$, AsH$_3$ and KPH$_2$. In addition, the reported reaction yields are too low to even be considered usefull for routine laboratory applications. Thus, we determined that the synthetic routes of these compounds could not be viable for large scale industrial use.

On the other hand, there have been very few reports concerning the germaniun analogs (GeH$_3$)$_3$E. See S. Cradock, E. A. V. Ebsorth, G. Davidson, L. A. Woodard, *J. Chem. Soc. A,* 8, 1229, (1967); D. W. H. Rankin, A. G. E. Robiet, G. M. Sheldrick, 5 Beagley, T. G. Hewit, *J. Inorg. Nucl. Chem.,* 31, 2351, (1969); E. A. V. Ebswort, D. J. Hutchison, J. Douglas, D. W. H. Rankin, *J. Chem. Res., Synop,* 12, 393, (1980); E. A. V. Ebsworth, D. W. H. Rankin, G. M. Sheldrick, *J. Chem. Soc. A,* 11, 2828, (1968); D. E. Wingeleth, A. D. Norman, *Phosphorus Sulfur,* 39, 123, (1988). These papers describe initial preparation methods and preliminary identifications of such compounds. However, the yields obtained and the experimental synthetic procedures described are not viable for industrial or laboratory applications. Moreover, we found no report describing the tin (SnH$_3$)$_3$Sn and lead (PbH$_3$)$_3$Pb species. We decided to investigate (GeH$_3$)$_3$P, (GeH$_3$)$_3$As, (GeH$_3$)$_3$Sb as desirable compounds for the synthesis of Ge$_{1-x-y}$Sn$_x$P(As, Sb)$_y$ systems.

(GeH$_3$)$_3$P has been previously obtained by treating a small excess of GeH$_3$Br with (SiH$_3$)$_3$P as illustrated by the equation:

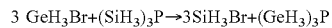

3 GeH$_3$Br+(SiH$_3$)$_3$P→3SiH$_3$Br+(GeH$_3$)$_3$P

No yield was reported and the product was characterized by hydrogen analysis, $^1$H and $^{31}$P NMR, IR and mass spectroscopy. (GeH$_3$)$_3$P was described as a colorless liquid with a melting point of −83.8° C. and a vapor pressure of 1 mmHg at 0° C. See S. Cradock, B. A. V. Ebsorth, G. Davidson, L. A. Woodard, *J. Chem. Soc. A,* 8, 1229, (1967); D. W. H. Rankin, A. G. E. Robiet, G. M. Sheldrick, 5 Beagley, T. G. Hewit, *J. Inorg. Nucl. Chem.,* 31, 2351. Before the method of our invention, the (GeH$_3$)$_3$As and (GeH$_3$)$_3$Sb compounds were prepared in low yields by the reaction of bromogermane with the corresponding silyl compounds (which as indicated above are difficult to produce in sufficient yields to be practical reagents for routine laboratory synthesis). See E. A. V. Ebsworth, D. W. H. Rankin, G. M. Shelcick, *J. Chem. Soc. A,* 11, 2828, (1968). (GeH$_3$)$_3$As and (GeH$_3$)$_3$Sb were identified and characterized by NMR, IR, and Raman spectroscopies. These molecules were found to decompose very slowly, over time, at room temperature to give germane and an unidentified involatile substance. Their vapor pressures were not reported but there was mention of distilling the liquids onto CsBr plates to obtain IR spectra, indicating that they are sufficiently volatile to allow significant mass transport under vacuum.

(GeH$_3$)$_3$P has also been synthesized by the redistribution reaction of silylphosphines and germylphosphines in the presence of B$_5$H$_9$, as described by Wimgeleth, A. D. Norman, *Phosphorus Sulfr,* 39, 123, (1988). In these reactions, B$_5$H$_9$ and GeH$_3$PH$_2$ were intermixed in the gas phase at room temperature and the trigermylphosphine (20% yield) was found in the reaction vessel along with PH$_3$, GeH$_4$, and unreacted starting material.

According to a preferred method of the present invention, we provide a new, convenient and high yield method to prepare (GeH$_3$)$_3$P, (Ge H$_3$)$_3$As, and (Ge H$_3$)$_3$Sb. This trigermyl family of compounds is safer and easier to handle and store than reagents such as PH$_3$, AsH$_3$ and KPH$_2$. This new method is based on the general reaction described by the equation below, and provides large concentrations of the final product (>70%) to allow thorough characterization, purification and ultimately routine application in film growth. According to this method, the more common and relatively inexpensive trimethylsilyl derivatives [(CH$_3$)$_3$Si)]$_3$E, {[(CH$_3$)$_3$Si)]$_3$P, [(CH$_3$)$_3$Si)]$_3$As, [(CH$_{3)3}$Si)]$_3$Sb }, are used as starting materials. Straightforward, large scale syntheses of these compounds is well known to those of skill in the art. The synthesis of E(GeH$_3$)$_3$ is achieved by thee reaction of GeH$_3$Br with [(CH$_3$)$_3$Si)]$_3$E according to the following equation:

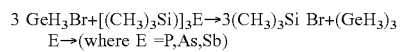

3 GeH$_3$Br+[(CH$_3$)$_3$Si)]$_3$E→3(CH$_3$)$_3$Si Br+(GeH$_3$)$_3$
E→(where E =P,As,Sb)

GeH$_3$Br is readily obtained by a single step reaction of GeH$_4$ with Br$_2$. The (GeH$_3$)$_3$E products are obtained as colorless volatile liquids and are purified by trap-to-trap fractionation.

Using this method of the present invention, we have obtained yields of the (GeH$_3$)$_3$E products typically ranging from 70% to 76%. The $^1$H NMR and gas phase IR data of the products are consistent with the (GeH$_3$)$_3$P, (GeH$_3$)$_3$As and $(GeH_3)_3Sb$ molecular structures. These data conclusively reveal that we are able to synthesize and purify the desired compounds. FIG. 1 shows a typical gas-phase FTIR spectrum of trigermylarsine, $(H_3Ge)_3AS$ showing sharp absorption bands at 2077 (Ge—H stretching), 873, 829, 785 (Ge—H deformation), 530 and 487 $cm^{-1}$ (Ge—H rocking). The $^1H$ NMR spectroscopy (not shown) consisted of a sinlet Ge—H response at 3.896 ppm. The gas-phase IR spectrum is nearly identical with that of $(H_3Ge)_3P$ (which we synthesized using the same synthetic methodology) with a slight shift in absorption bands to lower wave numbers.

We have used the $(GeH_3)_3E$ compounds synthesized according to the preferred process described above as dopant sources to perform a survey of growth experiments to develop new semiconductor films on Si (100) using CVD. An alternative method for generating suitable dopant sources involves the preparation of the general family of compounds $EH_x(GeH_3)_{3-x}$ where x=1, 2 and E=P, As, Sb. These can be synthesized by reaction of inorganic or organometallic compounds of the B element with alkali germyls such as $KGeH_3$ or halogenated germanes such as $BrGeH_3$. The products can be readily isolated and purified to give semiconductor grade reagents for in situ doping applications.

The following examples help to further explain the method described above. It will be understood, however, that the examples are illustrative of the process and materials of the invention and that the invention is not limited only to these examples.

CVD Depositions of $As(GeH_3)_3$

Depositions of pure trigermylarsine $(As(GeH_3)_3)$ via ultra-high vacuum CVD (UHV-CVD) showed that the molecule decomposes on Si (100) at temperatures as low as 350° C. to form thin films with approximately 30 at. % As. This indicates that the entire $Ge_3As$ molecular core is incorporated into the deposited material. Low-pressure CVD growth of As-doped $Ge_{1-x}Sn_x$ films was also demonstrated. Arsenic concentrations up to 3 at. % were obtained. Doping level incorporations were also achieved by reactions of appropriate concentrations of $As(GeH_3)_3$.

Figure 2:
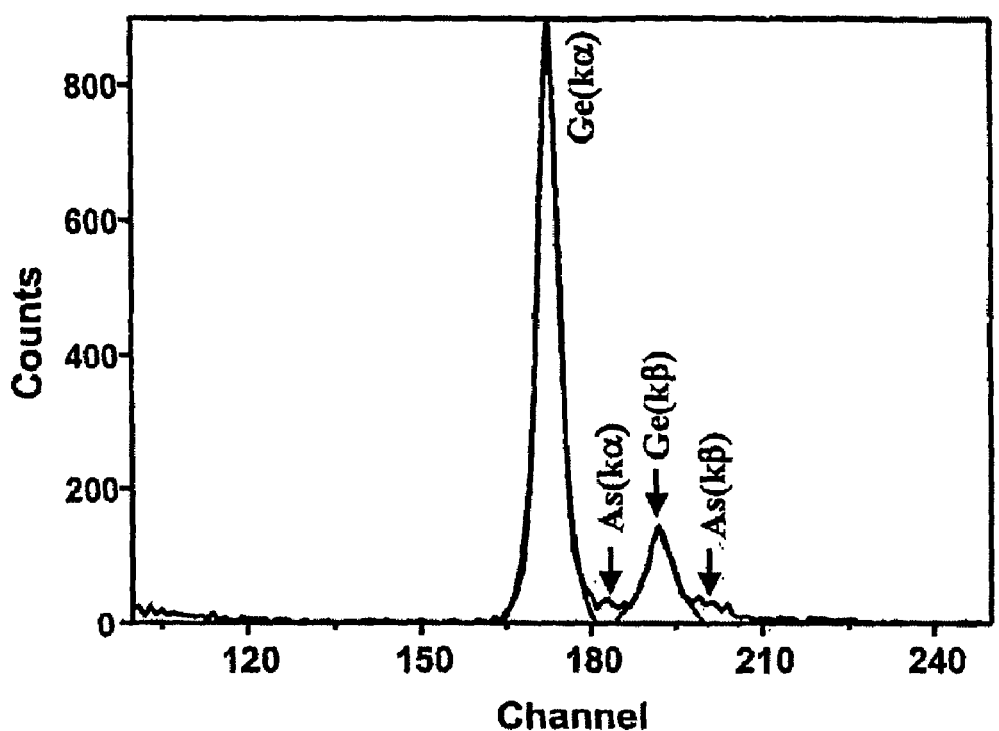
FIG. 2 shows the PIXE spectrum of a Ge—Sn:As film grown according to the present invention.
Figure 3:
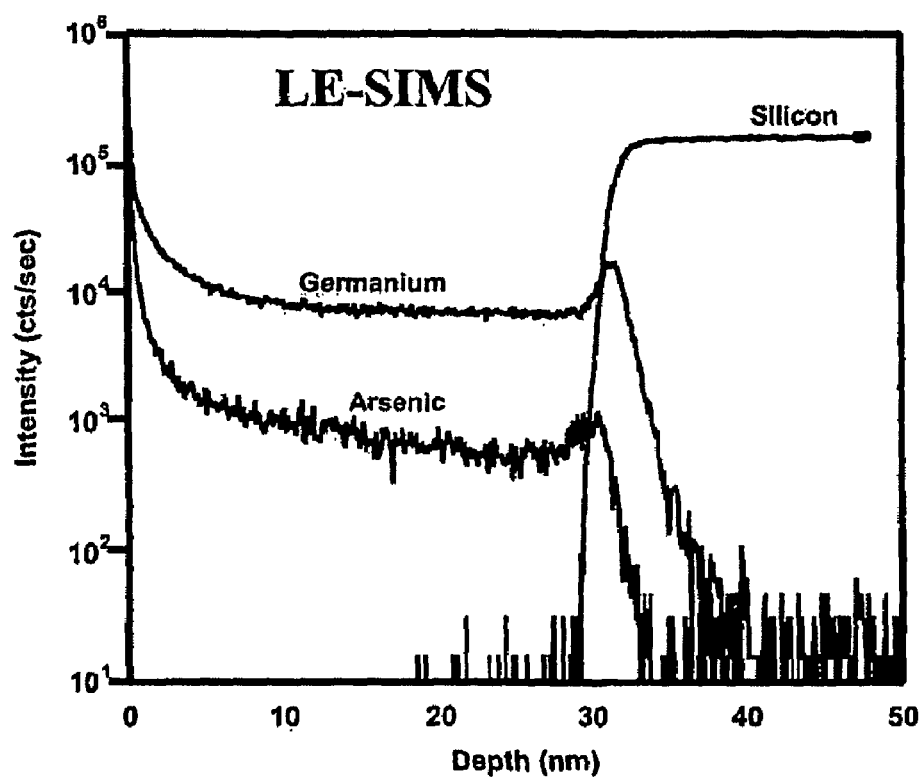
FIG. 3 is a low energy SIMS profile for Ge—Sn:As (3 at % As concentration) grown according to the present invention.

Our initial growth experiments demonstrated that compositional control of As in Ge—Sn can be obtained by simply varying the partial pressure of the reactant gases $As(GeH_3)_3$, $SnD_4$ and $Ge_2H_6$. We characterized the sample films using RBS to determine the Ge to Sn ratio and using particle-induced X-ray emission (PIXE) to determine the As concentrations. FIG. 2 shows the PIXE spectrum of sample Ge—Sn:As films. Quantification obtained from fitting the peaks shows that the sample films contained about 3 at. % As. We used Secondary Ion Mass Spectrometry depth profile analysis (SIMS) to determine the As elemental distribution and Hall/FTIR ellipsometry measurements to determine carrier concentrations and effective masses. Initial deposition studies have shown that As is readily incorporated into the Ge—Sn lattice. Low energy SIMS of the samples showed highly homogeneous profiles of As and the Ge and Sn constituent elements throughout the film. FIG. 3 is a low energy SIMS profile for a Ge—Sn:As (3 at % As concentration) sample. We used TEM to show that the microstructure and epitaxial character of the sample film is of good quality. X-ray diffraction showed that the sample film had an average diamond cubic lattice.

Following our initial growth experiments, we performed additional experiments using the process of our invention to grow sample $Ge_{1-x}Sn_x$ films doped with As atoms to determine optimal growth conditions for yielding high quality layers with crystalline perfection and phase homogeneity required for many desirable device applications. For these experiments, we utilized UHV-CVD reaction of $SnD_4$, $Ge_2H_6$ and $As(GeH_3)_3$ at 350° C. Concentrations of the reactants were selected to obtain the desired composition in the alloy.

Figure 4:
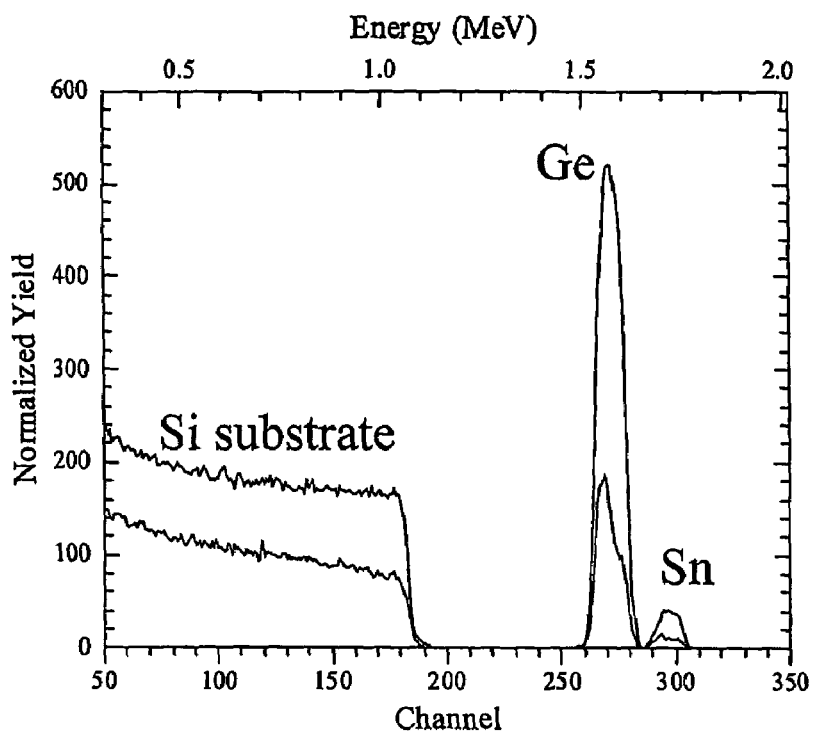
FIG. 4 shows aligned and random RBS spectra represented by the low and high intensity traces, respectively, of a 120 nm $Ge_{0.97}Sn_{0.03}$ film doped with As grown on Si according to the method of the present invention.
Figure 5:
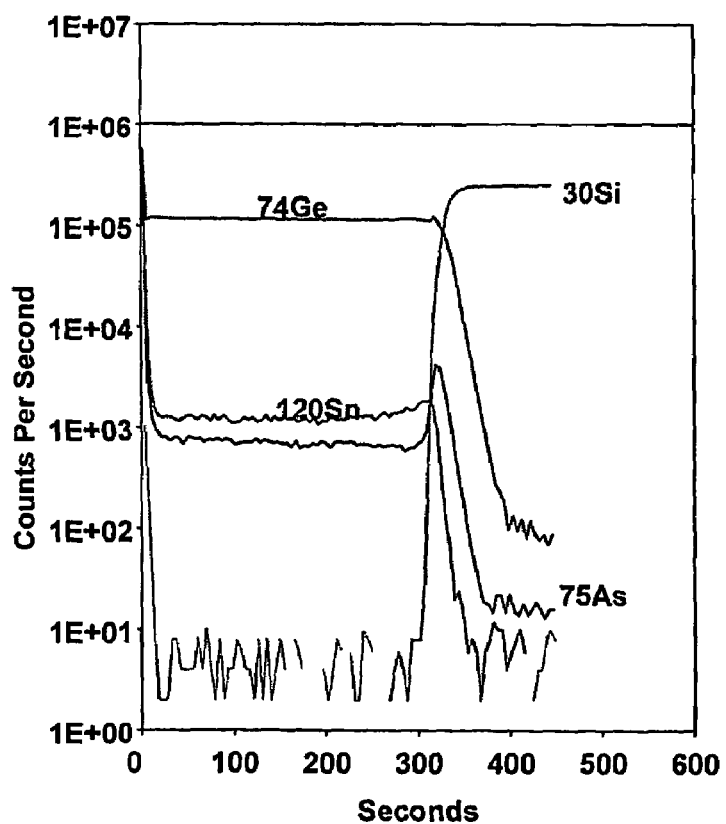
FIG. 5 is a low energy SIMS profile of a $Sn_{0.03}Ge_{0.97}$ sample doped with As according to the present invention.
Figure 6:
FIG. 6 is a cross sectional view of a layer of GeSn;As/Si(100) showing a highly uniform film thickness and smooth and continuous surface morphology.
Figure 7:
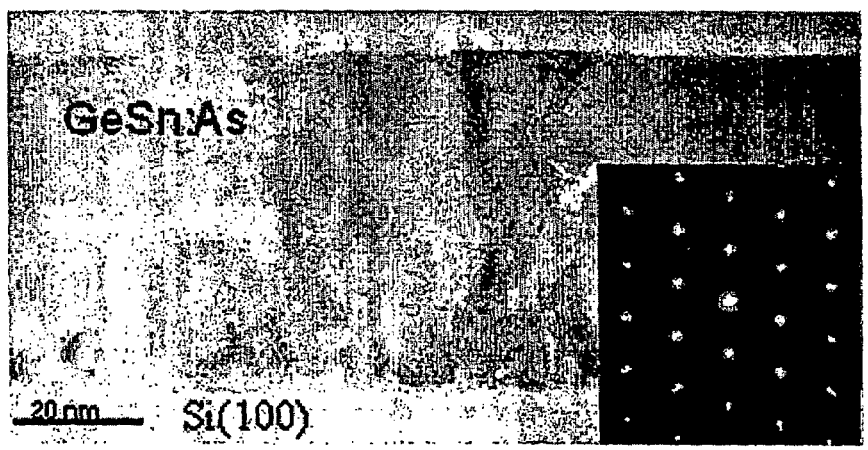
FIG. 7 is a magnified view of the GeSn;As/Si(100) heterostrucure grown according to the invention, showing that most of the defects are concentrated near the film/substrate interface while the upper portion of the layer remains relatively defect free. The inset shows an electron diffraction pattern indicating a highly aligned and epitaxial GeSn:As layer on Si.
Figure 8:
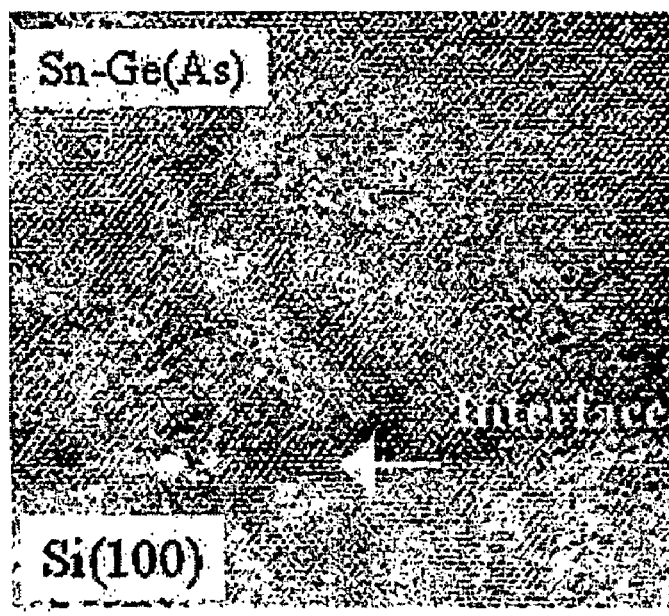
FIG. 8 is a high resolution image of the film/substrate interface of a $Ge_{0.97}Sn_{0.03}$:As film grown on Si (100). The image is in the (110) projection and shows high quality heteroepitaxial character.

FIGS. 4-9 show results of our characterization of a resulting $Ge_{0.97}Sn_{0.03}$ film doped in situ with arsenic using the $As(GeH_3)_3$ compound as the source of the As atoms. Again, we used Rutherford backscattering (RBS) to determine the bulk concentration of the resulting films and low energy SIMS to obtain the As. elemental profile. FIG. 4 shows a typical RBS spectrum of a Ge—Sn sample dope with As. The Ge and Sn concentrations were found to be 97% and 3 at. %, respectively. The As content was determined by SIMS to be $1.71 \times 10^{21}$ atoms/$cm^3$. The channeling for both Ge and Sn is identical, indicating that the material is single phase and that the elements occupy substitutional sites in the same average diamond structure. FIG. 5 shows a low energy SIMS profile of a $Sn_{0.03}Ge_{0.97}$ sample doped with As. The elemental profiles indicate that the films have a highly uniform As concentration throughout the sample. These SIMS data were used to quantify the dopant content using implanted samples of known concentration as a standard, and the As content of the $Sn_{0.03}Ge_{0.97}$ sample was determined to be $\sim 10^{21}$ atoms per $cm^3$ FIGS. 6-8 show cross sectional electron micrographs of the Ge—Sn:As sample films, which indicate single crystal quality, a high degree of epitaxial alignment and smooth surface morphology. FIG. 6 is a cross sectional view of the entire layer of a GeSn:As/Si(100) sample showing a highly uniform film thickness and smooth and continuous surface morphology. FIG. 7 is a magnified view of the GeSn:As/Si (100) heterostrucure showing that most of the defects are concentrated near the film/substrate interface while the upper portion of the layer remains relatively defect free. The inset of FIG. 7 is a selected area electron diffraction pattern which shows that the epitaxial GeSn:As layer is highly aligned on the Si substrate. FIG. 8 is a high resolution image of the interface in the (110) projection showing high quality heteroepitaxial character.

Figure 9:
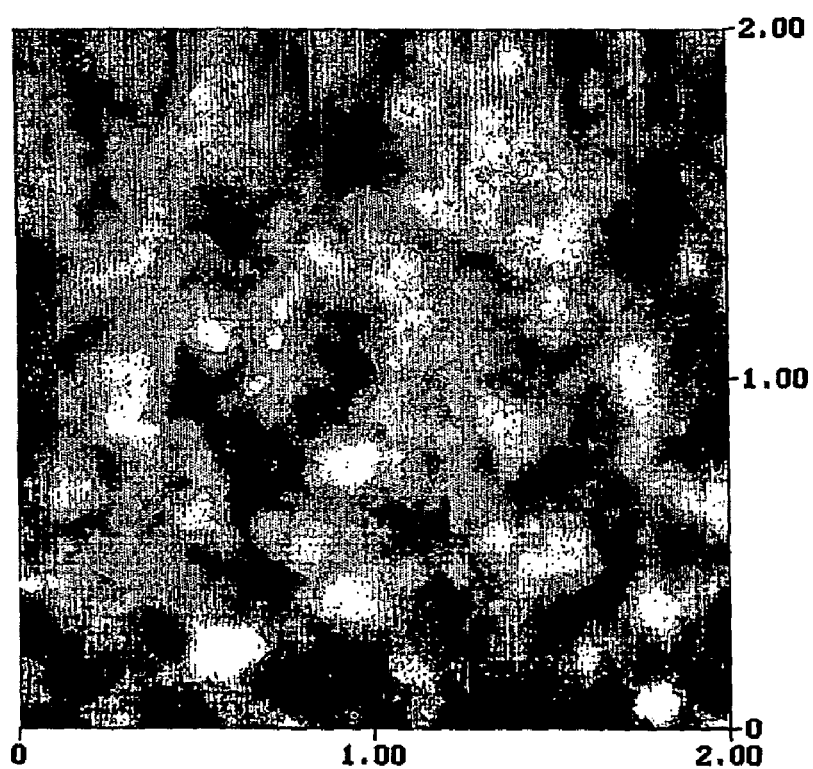
FIG. 9 is an atomic force microscope image of the a $Ge_{0.97}Sn_{0.03}$:As film grown on Si (100) according to the present invention.

Atomic force microscopy was used to examine the surface structure and morpholoy of the $Ge_{0.97}Sn_{0.03}$:As film. FIG. 9 is an atomic force microscopy (AFM image of such a film, showing extremely smooth surface topology with a typical RMS value of 0.7 nm.

CONCLUSION

The above-described invention possesses numerous advantages as described herein. The invention in its broader aspects is not limited to the specific details, representative devices, and illustrative examples shown and described. Those skilled in the art will appreciate that numerous changes and modifications may be made to the preferred embodiments of the invention and that such changes and modifications may be made without departing from the spirit of the invention. It is therefore intended that the appended claims cover all such equivalent variations as fall within the true spirit and scope of the invention.

What is claimed is:

1. A method for synthesizing a compound having the formula $E(GeH_3)_3$ wherein E is selected from the group consisting of arsenic (As), antimony (Sb) and phosphorus (P), the method comprising combining $GeH_3Br$ with $[(CH_3)_3Si]_3E$ under conditions whereby $E(GeH_3)_3$ is obtained.

2. The method of claim 1 further comprising purifying the obtained $E(GeH_3)_3$.

3. The method of claim 1 wherein the step of purifying the obtained $E(GeH_3)_3$ comprises trap-to-trap fractionation.

4. The method of claim 1 wherein $E(GeH_3)_3$ is obtained with a yield from about 70% to about 76%.

5. A method for synthesizing a compound having the formula $E(GeH_3)_3$ wherein E is selected from the group consisting of arsenic (As), antimony (Sb) and phosphorus (P), the method comprising combining $GeH_3Br$ with $[(CH_3)_3Si]_3E$ to obtain $E(GeH_3)_3$ according to the formula:

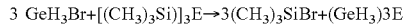

6. The method of claim 5 further comprising purifying the obtained $E(GeH_3)_3$.

7. The method of claim 5 wherein the step of purifying the obtained $E(GeH_3)_3$ comprises trap-to-trap fractionation.

8. The method of claim 5 wherein $E(GeH_3)_3$ is obtained with a yield from about 70% to about 76%.

9. A method for doping a region of a semiconductor material in a chemical vapor deposition reaction chamber, the method comprising introducing into the chamber a gaseous precursor having the formula $E(GeH_3)_3$, wherein E is selected from the group consisting of arsenic (As), antimony (Sb) and phosphorus (P).

10. The method of claim 9 wherein the semiconductor material comprises silicon (Si).

11. The method of claim 9 wherein the semiconductor material comprises germanium (Ge).

12. The method of claim 9 wherein the semiconductor material comprises SiGeSn.

13. The method of claim 9 wherein the semiconductor material comprises SnGe.

14. A method for depositing a doped epitaxial Ge—Sn layer on a substrate in a chemical vapor deposition reaction chamber, the method comprising:
   introducing into the chamber a gaseous precursor comprising $SnD_4$ mixed in $H_2$ under conditions whereby the epitaxial Ge—Sn layer is formed on the substrate; and
   introducing into the chamber a gaseous precursor having the formula $E(GeH_3)_3$, wherein E is selected from the group consisting of arsenic (As), antimony (Sb) and phosphorus (P).

15. The method of claim 14 wherein the gaseous precursor is introduced at a temperature in a range of about 250° C. to about 350° C.

16. The method of claim 14 wherein the substrate comprises silicon.

17. The method of claim 14 wherein the silicon comprises Si(100).

18. The method of claim 14 wherein the Ge—Sn layer comprises $Sn_xGe_{1-x}$ and x is in a range from about 0.02 to about 0.20.

19. A method for forming a Group IV semiconductor film, the method comprising
   forming the Group IV semiconductor film by a chemical vapor deposition method, wherein the Group IV semiconductor film is doped with impurities comprising an element E at a concentration ranging from about $10^{21}$ atoms/cm$^3$ to about several percent using a precursor having the formula $E(GeH_3)_3$ wherein E is selected from the group consisting of arsenic (As), phosporous (P) and antimony (Sb).

20. A method for forming a Group IV semiconductor film, the method comprising:
   forming the Group IV semiconductor film by a chemical vapor deposition method; and
   while forming the Group IV semiconductor film, doping the film with impurities comprising an element B at a concentration ranging from about $10^{21}$ atoms/cm$^3$ to about 3 at. % using a precursor having the formula $E(GeH_3)_3$ wherein B is selected from the group consisting of arsenic (As), antimony (Sb) and phosphorus (P).

21. The method for forming a Group IV semiconductor film according to claim 20, wherein arsenic (As), antimony (Sb) and phosphorus (P) are added to the Group IV semiconductor film by diffusion methods.

22. The method for forming a Group IV semiconductor film according to claim 20, wherein the doping step comprises introducing into a reaction chamber the precursor having the formula $E(GeH_3)_3$ and a reactant comprising $SnD_4$, $GeH_4$ or $Ge_2H_6$.

23. A method of preparing $(E)H_x(GeH_3)_{3-x}$ where x=1 or 2 and E is selected from the group consisting of P, As, Sb, the method comprising reacting inorganic or organometallic compounds of the E element with an alkali germyl or a halogenated germane.

24. The method of preparing $(E)H_x(GeH_3)_{3-x}$ according to claim 23 wherein the alkali germyl comprises $KGeH_3$.

25. The method of preparing $(R)H_x(GeH_3)_{3-x}$ according to claim 23 wherein the halogenated germane comprises $BrGeH_3$.

* * * * *